US012693583B2

(12) United States Patent
Moore

(10) Patent No.: US 12,693,583 B2
(45) Date of Patent: Jul. 28, 2026

(54) MAGNETIC CAMERA MOUNT

(71) Applicant: Jason Moore, Indianapolis, IN (US)

(72) Inventor: Jason Moore, Indianapolis, IN (US)

( * ) Notice: Subject to any disclaimer, the term of this patent is extended or adjusted under 35 U.S.C. 154(b) by 187 days.

(21) Appl. No.: 18/775,383

(22) Filed: Jul. 17, 2024

(65) Prior Publication Data

US 2025/0028230 A1 Jan. 23, 2025

Related U.S. Application Data

(60) Provisional application No. 63/527,173, filed on Jul. 17, 2023.

(51) Int. Cl.
| | |
|---|---|
| *G03B 17/56* | (2021.01) |
| *F21V 21/096* | (2006.01) |
| *H02S 20/30* | (2014.01) |
| *H04R 1/02* | (2006.01) |
| *H05K 5/02* | (2006.01) |

(52) U.S. Cl.
CPC .......... *G03B 17/561* (2013.01); *F21V 21/096* (2013.01); *H02S 20/30* (2014.12); *H04R 1/026* (2013.01); *H05K 5/0217* (2013.01)

(58) Field of Classification Search
CPC ...... G03B 17/561; H02S 20/30; F21V 21/096
See application file for complete search history.

(56) References Cited

U.S. PATENT DOCUMENTS

2009/0185370 A1* 7/2009 Moore ...................... F21S 4/10
362/219

* cited by examiner

*Primary Examiner* — Minh Q Phan
(74) *Attorney, Agent, or Firm* — Woodard Emhardt Henry Reeves & Wagner LLP

(57) ABSTRACT

The present disclosure provides a camera mounting system for use with a rain gutter. In some forms, the system comprises an anchor comprising a metallic material, and a mount body comprising a base having one or more magnets. The mount body may also comprise an attachment member configured to securely attach to a camera. The mount body is configured to magnetically adhere through a portion of the rain gutter to the anchor.

20 Claims, 3 Drawing Sheets

Fig. 2

MAGNETIC CAMERA MOUNT

BACKGROUND

The present disclosure relates generally to the field of camera mounts. As further background, many current external camera mount systems require permanent alteration of the structure to which they are attached. For example, many camera mounting systems require drilling into the exterior wall of a building. Often such modifications are not possible, for example when a property is rented or leased.

There remain needs for improved or alternative devices and methods for outdoor camera mounting. Aspects of the present disclosure are addressed to these needs.

BRIEF DESCRIPTION OF THE DRAWINGS

FIG. 2 provides a side view of one embodiment of a camera mount system as provided by the present disclosure.

DETAILED DESCRIPTION

Figure 1:
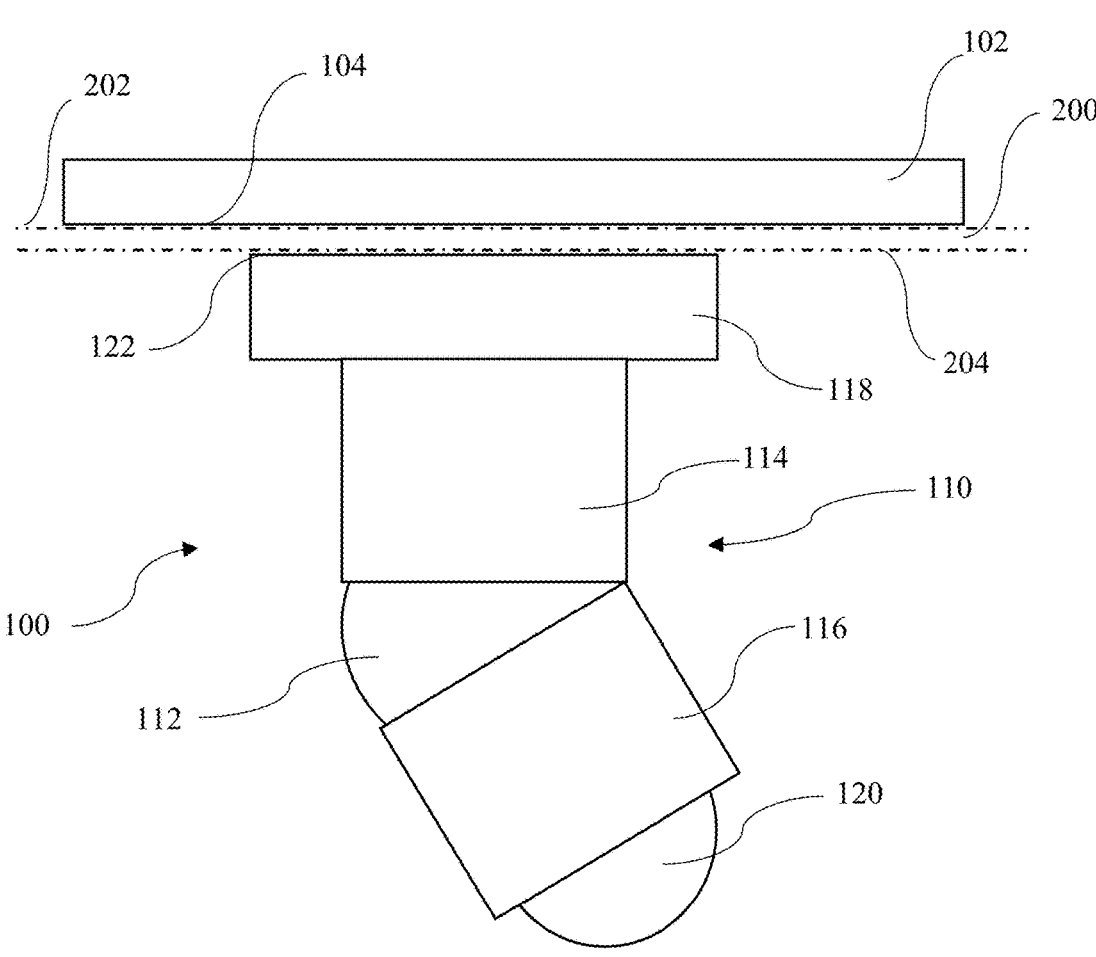
FIG. 1 provides a side view of one embodiment of a camera mount system as provided by the present disclosure.

Reference will now be made to certain embodiments, some of which are illustrated in the drawings, and specific language will be used to describe the same. It will nevertheless be understood that no limitation of the scope of the disclosure is thereby intended. Any alterations and further modifications in the described embodiments and any further applications of the principles as described herein are contemplated as would normally occur to one skilled in the art to which this disclosure relates.

As disclosed above, aspects of the present disclosure relate to systems and methods for mounting a camera. In particular, the present disclosure relates to systems and methods for mounting a camera to a rain gutter. Most residential buildings have rain gutters positioned at the lower edges of the roof to catch rainfall and receive water flowing off the roof. Such rain gutters are positioned around the exterior of the structure and provide an interior channel for directing rain flow. Camera mount systems of the present disclosure advantageously attach to a rain gutter without requiring modification of the rain gutter and can be easily removed without damage to the rain gutter. Accordingly, the present disclosure provides a camera mount system comprising an anchor configured to fit inside a rain gutter, and a mount body configured to be positioned outside of the rain gutter and is magnetically attached to the anchor through a portion of the rain gutter.

With reference to FIG. 1, shown is one embodiment of a mount system 100 as disclosed herein. In the illustrated embodiment, mount system 100, comprises anchor 102 and mount body 110. The system is attached to gutter 200, shown in cross-section. Anchor 102 is positioned within the interior space of gutter 200. Anchor 102 comprises anchor contact surface 104 in contact with gutter inner surface 202. The illustrated embodiment further comprises mount body 110, comprising base 118, primary portion 114, hinge 112, support portion 116, and attachment member 120. Base 118 is configured to magnetically adhere to anchor 102 through gutter 200. In this way, base 118 comprises base contact surface 122 contacting gutter outer surface 204.

In certain embodiments, the anchor comprises an elongate plate and is dimensioned to lay flat along the inner surface of a rain gutter. The anchor may have any suitable length, so as to allow for easy repositioning of the mount body. Preferably the anchor has a width suitable to lay flat within the rain gutter. For example, in some forms the anchor has a width of 2 inches to 8 inches, preferably 2⅛ inches to 6¾ inches. In accordance with some forms the anchor width is less than 8 inches, preferably less than 7 inches. The thickness, or depth of the anchor is preferably minimal so as to minimize obstruction to fluid flow through the rain gutter. In certain embodiments, the anchor comprises one or more beveled or chamfered edges to prevent accumulation of debris and encourage fluid flow over or around the anchor. The anchor preferably comprises a metallic material selected to allow strong magnetic adhesion of the mount body. In some forms, all or part of the anchor may be coated so as to prevent rusting of the material. In some forms, the anchor may comprise an adhesive layer to secure the anchor to the interior of the rain gutter.

In accordance with some forms, the mount body comprises one or more attachment members configured to attach to a camera or other device. Any suitable camera or other device may be used with the mounting systems of the present disclosure, for example a battery powered digital camera. The camera or other device may be attached to the mount body by any suitable means, for example a ball and socket joint, a press-fit attachment, a magnetic attachment, etc. As disclosed herein, certain embodiments of the mount body comprise one or more hinges. Such hinges are configured to facilitate placement of the camera or other device and are configured to maintain position against wind or other forces once placed. Certain embodiments may include one or more locking means to lock the position of the hinges.

As detailed above, the base is configured to magnetically adhere to the anchor through a portion of the rain gutter. In this way, in certain embodiments the base comprises one or more magnets. In certain embodiments, the base itself is composed of a magnetic material. In some forms, the base comprises one or more magnets positioned on the base contact surface. Any suitable magnets may be used, for example magnets comprising: iron, nickel, cobalt, and/or rare earth metal alloys.

The present disclosure provides methods of securing a device to a rain gutter or other suitable structure. In some forms such methods may comprise positioning an anchor as disclosed herein within an interior space of the rain gutter. As disclosed in more detail above, the anchor may comprise a metallic material and preferably comprises a generally flat shape so as to not interfere with fluid flow through the gutter. In certain embodiments the method comprises securing a device to a mount body as disclosed herein. Such methods may also comprise adhering the mount body to the rain gutter by magnetically adherence through the rain gutter. Optionally, the position of the device may be adjusted by moving the base and/or mount body and/or adjusting one or more hinges positioned on the mount body. Finally, the method may include the step of locking the position of the one or more hinges in place so as to secure the position of the device. In this way, the device mount system can be easily repositioned or removed by simply detaching the magnetic base from the gutter, providing a flexible and non-invasive solution for outdoor device installation.

It is within the scope of this disclosure to provide a camera or other device having an integrated magnet and/or mount body configured for use with an anchor as disclosed herein. It is further within the scope of the invention to provide a device and/or method of use of same as disclosed herein except the anchor comprises one or more magnets and the mount body and/or camera comprises a suitable metallic material.

In addition to camera mounts, systems and methods of the present disclosure may be utilized to position a variety of devices below or along a rain gutter. Such devices may include: weather monitoring devices (e.g. thermostats, rain monitoring devices, and/or wind monitoring devices), lights, motion sensors, battery, networking equipment (e.g. wifi extenders), speakers, solar panels, and/or décor (e.g. garland, flags, etc.). In some forms, one or more of such devices may be magnetically adhered to a single anchor. For example, in accordance with some forms an electrically powered device and an external battery are each magnetically adhered to an anchor such that they may be positioned to allow connection of the battery to the device (e.g. camera, light, sensor, networking equipment, speaker, solar panel, etc.). In some forms such devices may be configured to operate together, for example a motion sensor and a light and/or siren may be positioned together.

Figure 2:
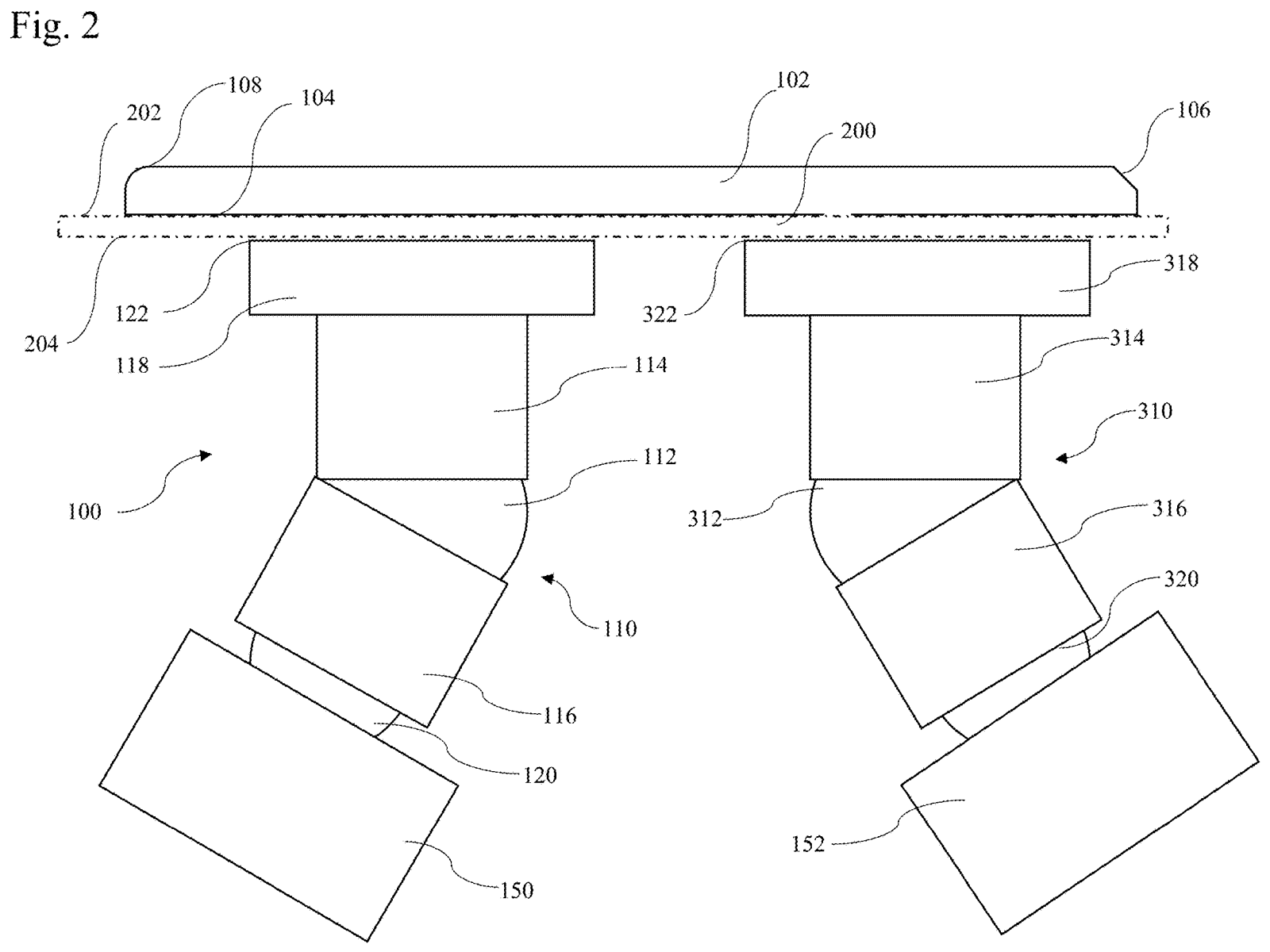

Turning now to FIG. 2, shown is one embodiment of a mount system 100 comprising an anchor 102 and a mount body 110 similar to that shown in FIG. 1 and described above. The embodiment illustrated in FIG. 2 comprises a second mount body 310 magnetically adheres to anchor 102 through gutter 200, shown in cross-section. Anchor 102 is positioned within the interior space of gutter 200. Anchor 102 comprises anchor contact surface 104 in contact with gutter inner surface 202. As shown in the illustrated embodiment, second mount body 310, comprises base 318, primary portion 314, hinge 312, support portion 316, and attachment member 320. Base 318 is configured to magnetically adhere to anchor 102 through gutter 200. In this way, base 318 comprises base contact surface 322 contacting gutter outer surface 204. The illustrated embodiment includes first device 150 secured to attachment member 120, and second device 350 secured to attachment member 320. First device 150 and second device 350 may each comprise any of the suitable device disclosed herein. The embodiment illustrated in FIG. 2 further comprises a rounded edge 108 and a beveled or chamfered edge 106. Such edges may or may not be present with any of the embodiments described herein. In some forms the anchor comprises a four-sided plate, wherein two or more of the edges is modified to encourage fluid flow over the anchor (e.g. rounded, beveled, and/or chamfered). In some forms the anchor comprises a rectangular plate and the edges of the plate intended to extend transvers to a longitudinal axis of the rain gutter and modified to encourage fluid flow over the anchor.

Figure 3:
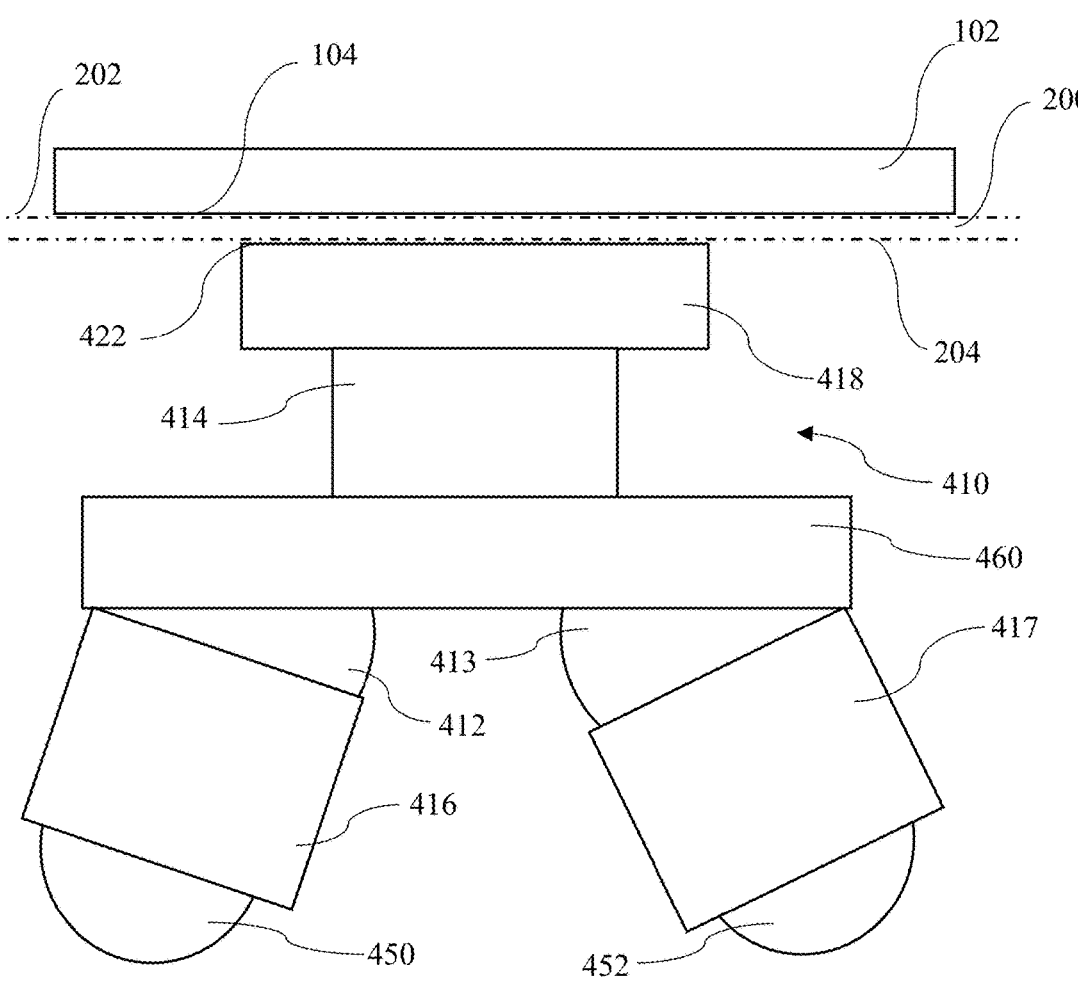
FIG. 3 provides a side view of one embodiment of a camera mount system as provided by the present disclosure.

In accordance with some forms, the present disclosure provides a mount body as described herein having two or more attachment members each configured to securely attach a separate device, such as those listed above, to a single mount body. Such mount bodies may include hinges and locking members as disclosed above to allow for positioning of multiple devices. With reference now to FIG. 3, shown is one embodiment of a mount system 100 comprising an anchor 102 and mount body 410. Similar to those embodiments discussed above, mount body 410 magnetically adheres to anchor 102 through gutter 200, shown in cross-section. Anchor 102 is positioned within the interior space of gutter 200. As shown in the illustrated embodiment, mount body 410, comprises base 418, and primary portion 414. In accordance with some forms, extension 460 is provided to allow for a plurality of attachment members. In the illustrated embodiment a first attachment member 450 is supported by a first support member 416 and a first hinge 412. The illustrated embodiment also includes a second attachment member 452 supported by a second support member 417 and a second hinge 413. Base 418 is configured to magnetically adhere to anchor 102 through gutter 200. In this way, base 418 comprises base contact surface 422 contacting gutter outer surface 204.

The uses of the terms "a" and "an" and "the" and similar references herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the products or methods defined by the claims.

While embodiments of the disclosure have been illustrated and described in detail in the drawings and foregoing description, the same is to be considered as illustrative and not restrictive in character, it being understood that only some embodiments have been shown and described and that all changes and modifications that come within the spirit of the disclosures herein are desired to be protected.

What is claimed is:

1. A mounting system for use with a rain gutter, the system comprising:
    an anchor comprising a metallic material; and
    a mount body comprising a base, the base comprising one or more magnets, and an attachment member configured to securely attach to a device, wherein the mount body is configured to magnetically adhere through a portion of the rain gutter to the anchor.

2. The mounting system of claim 1, wherein the anchor comprises an elongate plate having a maximum width of less than 8 inches.

3. The mounting system of claim 2, wherein the mount body comprises a hinge positioned between the base and the attachment member.

4. The mounting system of claim 1, wherein the anchor comprises one or more beveled or chamfered edges.

5. The mounting system of claim 1, wherein the anchor comprises a coating to prevent rusting.

6. The mounting system of claim 1, wherein the mount body comprises a hinged portion.

7. The mounting system of claim 6, wherein the hinged portion comprises a ball and socket joint.

8. The mounting system of claim 6, wherein the mount body comprises one or more locking means to lock the position of the hinged portion.

9. The mounting system of claim 1, wherein the base comprises magnets selected from the group consisting of iron, nickel, cobalt, and rare earth metal alloys.

10. The mounting system of claim 1, wherein said device comprises a camera.

11. The mounting system of claim 1, further comprising:
    a second mount body comprising a second base, the second base comprising one or more magnets; and a second attachment member configured to securely attach to a second device, the second mount body configured to magnetically adhere though a portion of the rain gutter to the anchor.

12. A method of securing a device to a rain gutter, the method comprising:

positioning an anchor within an interior space of the rain gutter, the anchor comprising a metallic material; and magnetically adhering a mount body through a portion of the rain gutter to the anchor.

13. The method of claim 12, comprising:

securing a device to the mount body.

14. The method of claim 13, wherein said device comprises a camera, a weather monitoring device, a light, a motion sensor, a battery, networking equipment, a solar panel, or a speaker.

15. The method of claim 12, comprising:

adjusting a hinge positioned on the mount body so as to adjust the position of the device.

16. The method of claim 15, comprising: locking a locking member to secure the position of the hinge.

17. The mounting system of claim 1, wherein said device comprises a solar panel.

18. The mounting system of claim 1, wherein said device comprises a light.

19. The mounting system of claim 1, wherein said device comprises networking equipment.

20. The mounting system of claim 1, wherein said device comprises a speaker.

\* \* \* \* \*